United States Patent
Saito et al.

(10) Patent No.: US 8,980,672 B2
(45) Date of Patent: Mar. 17, 2015

(54) PHOTOVOLTAIC CELL AND METHOD FOR MANUFACTURING THE SAME

(75) Inventors: Mitsunaga Saito, Inzai (JP); Masahiro Hosoya, Okegawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/590,747

(22) Filed: Aug. 21, 2012

(65) Prior Publication Data

US 2013/0213461 A1 Aug. 22, 2013

Related U.S. Application Data

(63) Continuation of application No. PCT/JP2010/052652, filed on Feb. 22, 2010.

(51) Int. Cl.
*H01L 21/00* (2006.01)
*H01L 31/18* (2006.01)
(Continued)

(52) U.S. Cl.
CPC ............ *H01L 31/1864* (2013.01); *B82Y 10/00* (2013.01); *H01L 51/0026* (2013.01); *H01L 51/0027* (2013.01); *H01L 51/0047* (2013.01); *H01L 51/424* (2013.01); *Y02E 10/549* (2013.01); *H01L 31/022425* (2013.01); *H01L 31/03529* (2013.01)
USPC ................. 438/57; 438/82; 438/88; 438/98

(58) Field of Classification Search
CPC .............. H01L 51/0026; H01L 31/186; H01L 31/1864; H01L 51/424; H01L 51/0046; H01L 31/002425; H01L 31/03529
USPC .................................... 438/57, 98, 99, 82, 88

IPC ........................ H01L 51/0026,31/186, 31/1864
See application file for complete search history.

(56) References Cited

U.S. PATENT DOCUMENTS

| 4,695,717 | A | 9/1987 | Hirai et al. | |
|---|---|---|---|---|
| 6,784,017 | B2 * | 8/2004 | Yang et al. | 438/99 |

(Continued)

FOREIGN PATENT DOCUMENTS

| CN | 1524295 | | 8/2004 |
|---|---|---|---|
| CN | 1653627 | A | 8/2005 |

(Continued)

OTHER PUBLICATIONS

English translation of the International Preliminary Report on Patentability issued Sep. 27, 2012 in PCT/JP2010/052652 filed Feb. 22, 2010.

(Continued)

*Primary Examiner* — Michael Trinh
(74) *Attorney, Agent, or Firm* — Oblon, McClelland, Maier & Neustadt, L.L.P.

(57) ABSTRACT

According to one embodiment, there is provided a method for manufacturing a photovoltaic cell. The method includes forming a structure including a pair of electrodes which are arranged apart from each other, and a hetero-junction type photoelectric conversion layer interposed between the electrodes and containing a p-type semiconductor and a n-type semiconductor, and annealing the photoelectric conversion layer thermally while applying an AC voltage having a frequency of 0.01 kHz or more and less than 1 kHz to control a mixed state of the p-type semiconductor and n-type semiconductor in the photoelectric conversion layer.

16 Claims, 3 Drawing Sheets

(51) Int. Cl.
  *B82Y 10/00* (2011.01)
  *H01L 51/00* (2006.01)
  *H01L 31/0224* (2006.01)
  *H01L 31/0352* (2006.01)
  *H01L 51/42* (2006.01)

(56) References Cited

U.S. PATENT DOCUMENTS

| | | | |
|---|---|---|---|
| 6,872,970 B2* | 3/2005 | Halls et al. | 257/40 |
| 7,582,508 B2* | 9/2009 | Park | 438/99 |
| 2005/0268962 A1 | 12/2005 | Gaudiana et al. | |
| 2006/0011233 A1* | 1/2006 | Sariciftci et al. | 136/290 |
| 2008/0094320 A1* | 4/2008 | Parikh et al. | 345/76 |

FOREIGN PATENT DOCUMENTS

| | | |
|---|---|---|
| JP | 2004-207401 A | 7/2004 |
| JP | 2005-526404 | 9/2005 |
| JP | 2007-324259 | 12/2007 |
| WO | WO 2009/122575 | 10/2009 |
| WO | WO 2011/030411 A1 | 3/2011 |

OTHER PUBLICATIONS

English translation of the Written Opinion of the International Searching Authority issued May 25, 2010 in PCT/JP2010/052652 filed Feb. 22, 2010.

Office Action issued Feb. 5, 2013 in Japanese Patent Application No. 2012-500444 with English language translation.

International Search Report issued May 25, 2010 in PCT/JP2010/052652 filed Feb. 22, 2010.

Hiroki Watanabe, et al.; "Netsu Shorichu no Den'atsu Inka ga Yuki Usumaku Taiyo Denchi no Soshi Tokusei ni Oyobosu Koka"; Dai 56 Kai Extended Abstracts, Japan Society of Applied Physics and Related Societies, 2009, No. 3, pp. 1297.

Carole Sentein, et al.; "Study of orientation induced molecular rectification in polymer films"; Optical Materials, 1998, vol. 9, No. 1-4, pp. 316-322.

Chinese Office Action issued May 20, 2014, in China Patent Application No. 201080060395.4 (with English translation).

Office Action as received in the corresponding Chinese Patent Application No. 201080060395.4 dated Dec. 17, 2014 w/English Translation.

* cited by examiner

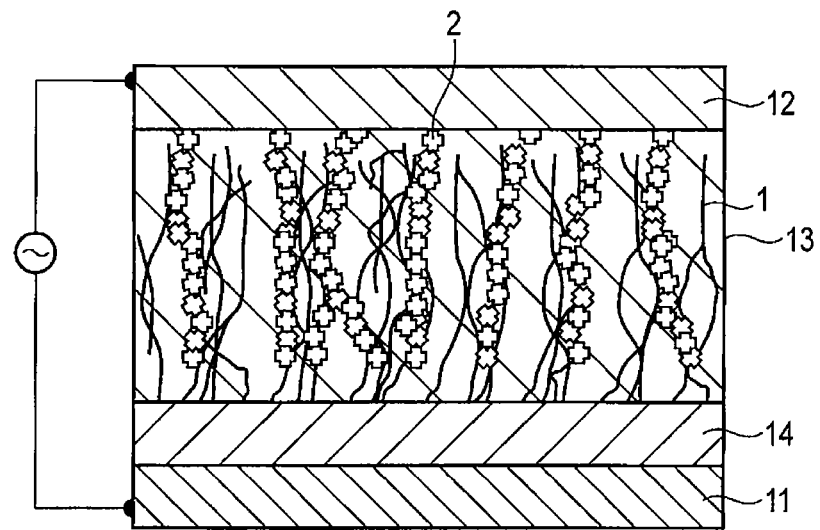
F I G. 3
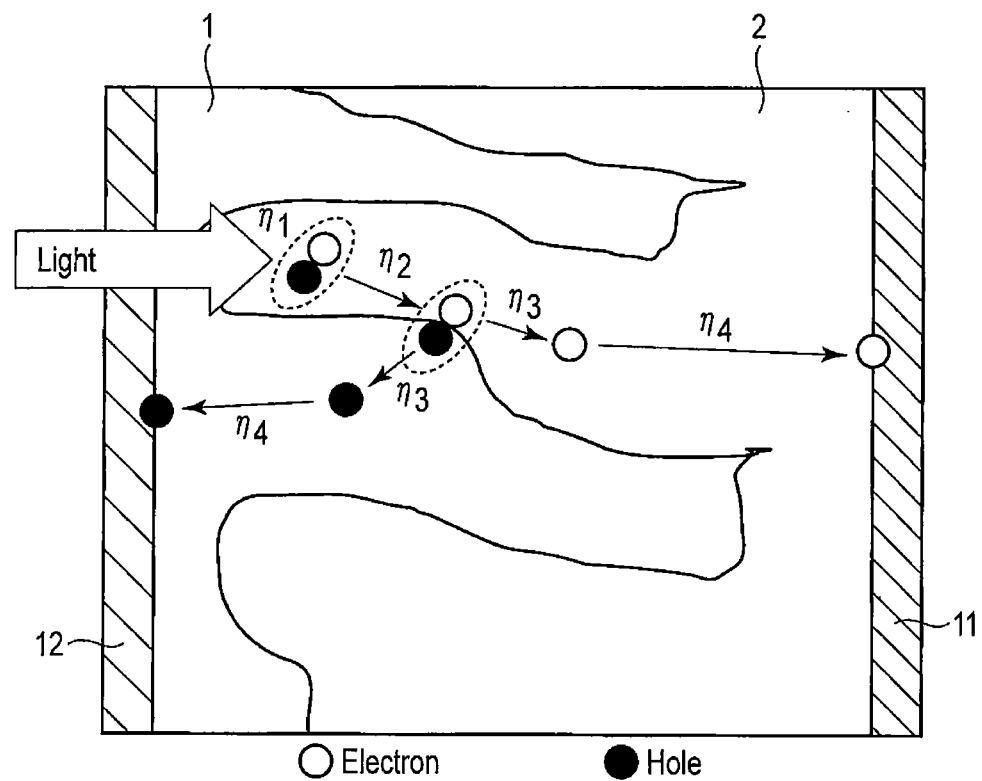
F I G. 4

PHOTOVOLTAIC CELL AND METHOD FOR MANUFACTURING THE SAME

CROSS-REFERENCE TO RELATED APPLICATIONS

This application is a Continuation application of PCT Application No. PCT/JP2010/052652, filed Feb. 22, 2010, the entire contents of which are incorporated herein by reference.

FIELD

Embodiments described herein relate generally to a photovoltaic cell and a method for manufacturing the photovoltaic cell.

BACKGROUND

An organic thin-film photovoltaic cell is a solar cell utilizing an organic thin-film semiconductor based on a combination of a conductive polymer, fullerene, etc. The organic thin-film photovoltaic cell is advantageous in that as compared with a solar cell based on an inorganic material, it can be manufactured through an easy process, thereby realizing low cost. However, the organic thin-film photovoltaic cell has a drawback that a photoelectric conversion efficiency and lifetime of the organic thin-film photovoltaic cell are inferior to those of conventional inorganic photovoltaic cells. A cause of the drawback is that there are a multiplicity of parameters whose control is difficult, such as semiconductor material purity, molecular weight distribution and orientation, with respect to the organic semiconductor for use in the organic photovoltaic cell.

Various elaborations for enhancing the photoelectric conversion efficiency of the organic photovoltaic cell have been made.

BRIEF DESCRIPTION OF THE DRAWINGS

FIG. 3 is a conceptual view showing a structure of a photoelectric conversion layer of a photovoltaic cell according to an embodiment;

FIG. 4 is a view for explaining a working mechanism of a bulk hetero-junction photovoltaic cell;

DETAILED DESCRIPTION

According to one embodiment, there is provided a method for manufacturing a photovoltaic cell, including:

forming a structure including a pair of electrodes which are arranged apart from each other, and a hetero-junction type photoelectric conversion layer interposed between the electrodes and containing a p-type semiconductor and a n-type semiconductor; and annealing the photoelectric conversion layer thermally while applying an AC voltage having a frequency of 0.01 kHz or more and less than 1 kHz to control a mixed state of the p-type semiconductor and n-type semiconductor in the photoelectric conversion layer.

Embodiments of the present invention will be explained below with reference to the drawings.

Figure 1:
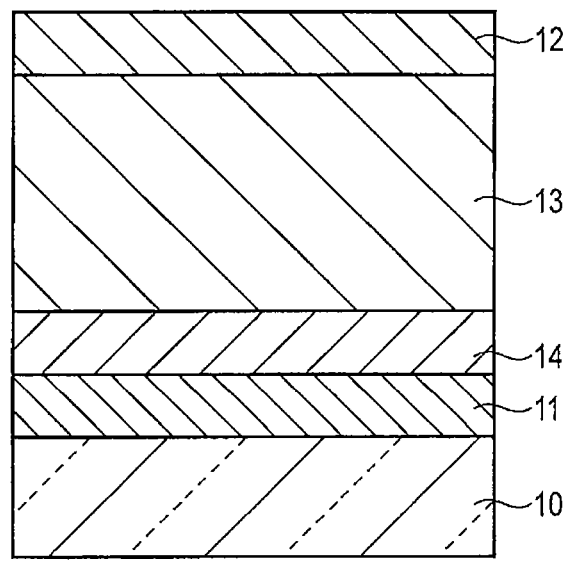
FIG. 1 is a cross-sectional view of a photovoltaic cell according to an embodiment.

FIG. 1 is a cross-sectional view of a photovoltaic cell according to an embodiment.

The photovoltaic cell shown in FIG. 1 has a structure provided with a pair of electrodes (positive electrode 11 and negative electrode 12) which are arranged apart from each other and a photoelectric conversion layer 13 arranged between the electrodes 11 and 12 on a substrate 10. The photovoltaic cell includes a hole transport layer 14 between the positive electrode 11 and the photoelectric conversion layer 13, optionally.

Figure 2:
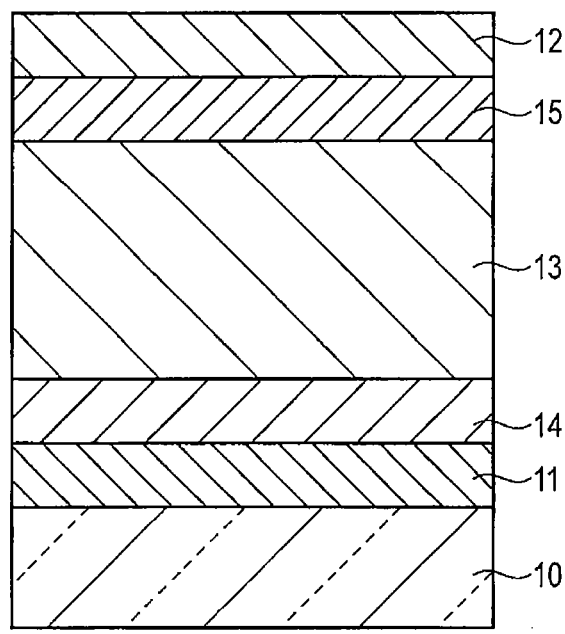
FIG. 2 is a cross-sectional view of a photovoltaic cell according to another embodiment.

FIG. 2 is a cross-sectional view of a photovoltaic cell according to another embodiment. The photovoltaic cell shown in FIG. 2 is further includes an electron transport layer 15 between the negative electrode 12 and the photoelectric conversion layer 13.

The photovoltaic cell according to an embodiment is characterized by the application of an AC voltage simultaneously when thermal annealing is carried out in the course of manufacture process. The application of the AC voltage enables the control of the mixed state of a p-type semiconductor and an n-type semiconductor in the photoelectric conversion layer, with the result that a photovoltaic cell improved in photoelectric conversion efficiency can be obtained.

In the case of conventional photovoltaic cells which are not subjected to after-treatment such as thermal annealing, these photovoltaic cells each have a structure in which a p-type semiconductor and an n-type semiconductor are uniformly dispersed in the photoelectric conversion layer. In such a structure, a path that transports charges generated by photo excitation to the electrode is not formed, causing significant deterioration in photoelectric conversion efficiency. When only thermal annealing is carried out, a certain degree of orientation based on the self-organization of a semiconductor material is caused, so that a path transporting charges is formed, which is, however, imperfect.

On the other hand, in the case of applying an AC voltage simultaneously when thermal annealing is carried out, a p-type semiconductor 1 and n-type semiconductor 2 are respectively self-organized to form a microphase-separated structure. The self-organized p-type semiconductor 1 and n-type semiconductor 2 are oriented in a direction perpendicular to the pair of electrodes 11, 12 and entangled with each other. FIG. 3 is a conceptual view showing a structure of a photoelectric conversion layer of a photovoltaic cell according to an embodiment. In FIG. 3 showing a structure obtained in the case of applying AC voltage in the thermal annealing, it is found that both the p-type semiconductor 1 and the n-type semiconductor 2 form a good transport path. In such a structure, carriers can be smoothly conducted to the electrodes 11, 12. As a result, it is considered that the photovoltaic cell can be improved in photoelectric conversion efficiency.

In another embodiment, an AC/DC superposition voltage obtained by superposing a DC voltage on a AC voltage may be used as the voltage to be applied. When the AC/DC superposition voltage is applied, the photoelectric conversion efficiency tends to be more improved than when an AC voltage on which a DC voltage is not superposed is applied.

A method for producing a photovoltaic cell according to an embodiment will be explained for each structural member.

(Substrate)

The substrate 10 serves to support other structural members. This substrate 10 forms electrodes and is therefore preferably one which is not denatured by heat or organic solvents. Examples of the material of the substrate 10 include inorganic materials such as non-alkali glass and quartz glass, plastic such as polyethylene, polyethylene terephthalate (PET), polyethylene naphthalate (PEN), polyimide, polyamide, polyamide-imide, liquid crystal polymer, and cycloolefin polymer; polymer film; and metal substrate such as stainless steel (SUS) and silicon. As a material of substrate 10, transparent materials or opaque materials can be used without any particular limitation. However, when an opaque substrate is used, an electrode arranged on the side opposite to the substrate 10 is preferably transparent or semitransparent. The thickness of the substrate 10 is not particularly limited as long as it has sufficient strength for supporting other members.

(Positive Electrode)

The positive electrode 11 is formed on the substrate 10. Any material may be used as the material of the positive electrode 11 without any particular limitation as long as it exhibits conductivity. Generally, a transparent or semitransparent material having conductivity is deposited by vacuum evaporation, sputtering, ion plating, plating, and coating methods, or the like. Examples of the transparent or semitransparent electrode material include a metal oxide film and a semitransparent metallic thin film exhibiting conductivity. Specifically, a film prepared by using conductive glass consisting of indium oxide, zinc oxide, tin oxide, indium tin oxide (ITO) which is a complex thereof, fluorine doped tin oxide (FTO), indium zinc oxide, and the like (NESA etc.); gold; platinum; silver; copper; and the like are used. Particularly, ITO or FTO is preferable. Further, as an electrode material, organic conductive polymer such as polyaniline, the derivatives thereof, polythiophene, the derivatives thereof, and the like may be used. When ITO is used as the positive electrode 11, the thickness thereof is preferably 30-300 nm. If the thickness is thinner than 30 nm, the conductivity is dropped, leading to increased resistance, which may cause deterioration of photoelectric conversion efficiency. When the thickness of the positive electrode is higher than 300 nm, ITO loses flexibility and is cracked when it is under stress. The sheet resistance of the positive electrode 11 is preferably as smaller as possible and is preferably 10Ω/□ or less. The positive electrode 11 may be a monolayer or stacked layers each composed of materials having various work functions.

(Hole Transport Layer)

The hole transport layer 14 is optionally arranged between the positive electrode 11 and the photoelectric conversion layer 13. The hole transport layer 14 has, for example, the functions of flattening the irregularities of the lower electrode to thereby prevent the development of a short circuit of a photovoltaic cell device, efficiently transporting only holes, preventing an extinction of excitons generated in the vicinity of the boundary of the photoelectric conversion layer 13, and the like. As a material of the hole transport layer 14, organic conductive polymers including polythiophene type polymers such as PEDOT/PSS (poly(3,4-ethylenedioxythiophene)-poly(styrenesulfonate)), polyaniline, and polypyrrole may be used. Typical examples of the polythiophene type polymer include Baytron PH500 manufactured by H.C. Starck Co., Ltd.

When Baytron PH500 is used as the material of the hole transport layer 14, a film thickness thereof is preferably 20 to 100 nm. When the film thickness is too low, the function of preventing the development of short circuits of the lower electrode is lost, resulting in the development of short circuits. When the film thickness is too high, the film resistance is increased, which limits generated current, resulting in lower photoelectric conversion efficiency.

Though no particular limitation is imposed on a method of forming the hole transport layer 14 insofar as it can form a thin film, the hole transport layer 14 may be formed by using a coating method such as the spin coating method. After a solution of the material for the hole transport layer 14 is applied in a desired film thickness, it can be dried by heating using a hot plate or the like. The solution to be applied may be filtrated with a filter in advance.

(Photoelectric Conversion Layer)

The photoelectric conversion layer 13 is arranged between the positive electrode 11 and the negative electrode 12. The photovoltaic cell according an embodiment is a hetero-junction type photovoltaic cell. Particularly, a bulk hetero-junction type photovoltaic cell among hetero-junction type is characterized by that a p-type semiconductor and an n-type semiconductor are mixed in the photoelectric conversion layer 13 to form a microphase separated structure. In the bulk hetero-junction type, the mixed p-type semiconductor and n-type conductor form a nano-order size pn-junction in the photoelectric conversion layer to obtain a current by utilizing a photocharge separation generated on an interface. The p-type semiconductor is constituted of a material having an electron-donating nature. The n-type semiconductor is, on the other hand, constituted of a material having an electron-accepting nature. In an embodiment, at least one of the p-type semiconductor and n-type semiconductor may be an organic semiconductor.

For example, a polythiophene and derivatives thereof, polypyrrole and derivatives thereof, pyrazoline derivatives, arylamine derivatives, stilbene derivatives, triphenyldiamine derivatives, oligothiophene and derivatives thereof, polyvinylcarbazole and derivatives thereof, polysilane and derivatives thereof, polysiloxane derivatives having an aromatic amine at its side chain or main chain, polyaniline and derivatives thereof, phthalocyanine derivatives, porphyrin and derivatives thereof, polyphenylenevinylene and derivatives thereof, polythienylenevinylene and derivatives thereof, and a combination thereof may be used as the p-type organic semiconductor. Further, copolymers of these compounds may be used. Examples of these copolymers include thiophene-fluorene copolymers and phenylene ethynylene-phenylenevinylene copolymers.

Preferable p-type organic semiconductor is polythiophene which is a conductive polymer having a n-conjugate and derivatives thereof. The polythiophene and derivatives thereof can secure excellent tacticity and have relatively higher solubility in a solvent. There is no particular limitation to the polythiophene and derivatives thereof insofar as these compounds have a thiophene skeleton. Specific examples of the polythiophene and its derivatives include polyalkylthiophenes such as a poly3-methylthiophene, poly3-butylthiophene, poly3-hexylthiophene, poly3-octylthiophene, poly3-decylthiophene, and poly3-dodecylthiophene; polyarylthiophenes such as a poly3-phenylthiophene, and poly3-(p-alkylphenylthiophene); polyalkylisohtionaphthenes such as a poly3-butylisothionaphthene, poly3-hexylisothionaphthene, poly3-octylisothionaphthene, and poly3-decylisothionaphthene; and polyethylenedioxythiophenes.

These conductive polymers can be each formed as a film by applying a solution in which each of these polymers is dissolved in a solvent. Therefore, these conductive polymers have the advantage that an organic thin-film photovoltaic cell having a large area can be manufactured by the printing method or the like in an inexpensive apparatus at low costs.

As the n-type organic semiconductor, fullerene and derivatives thereof are preferably used. As the fullerene derivatives used here, any derivative can be used without any particular limitation as long as it has fullerene skeleton. Specific examples of the fullerene derivatives include derivatives containing C60, C70, C76, C78, C84, or the like as a basic skeleton. The fullerene derivatives may be those in which carbon atoms on the fullerene skeleton are modified with optional functional groups, wherein these functional groups may be combined with each other to form a ring. Examples of the fullerene derivatives include fullerene-bonded polymers. Fullerene derivatives which have a functional group having high affinity to a solvent and are highly soluble in a solvent are preferably used.

Examples of the functional group in the fullerene derivatives include a hydrogen atom; a hydroxyl group; a halogen atom such as a fluorine atom and a chlorine atom; an alkyl group such as a methyl group and an ethyl group; an alkenyl group such as a vinyl group; a cyano group, an alkoxy group such as a methoxy group and an ethoxy group; an aromatic hydrocarbon group such as a phenyl group and a naphthyl group; and an aromatic heterocyclic group such as a thienyl group and a pyridyl group. Specific examples of the fullerene derivatives include hydrogenated fullerenes such as C60H36 and C70H36 and oxide fullerenes such as C60 and C70, and fullerene metal complexes.

It is more preferable to use 60PCBM ([6,6]-phenyl-C61 methyl butyrate or 70PCBM ([6,6]-phenylC71-methyl butyrate) among those mentioned above.

Examples of the specific structures of the fullerene derivatives are shown below.

-continued

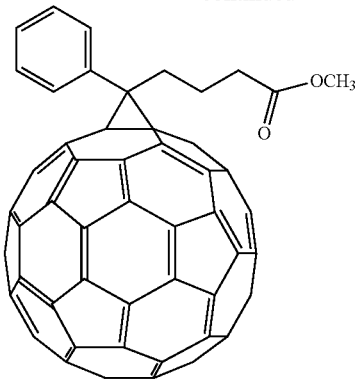

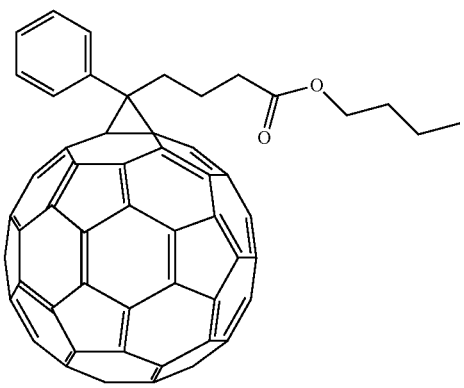

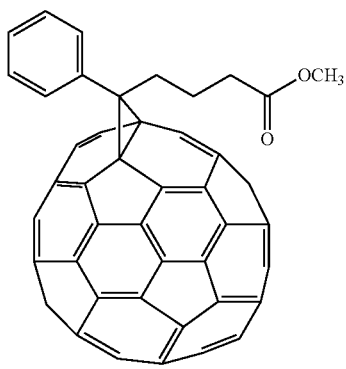

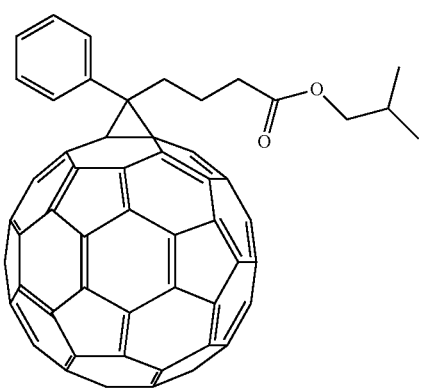

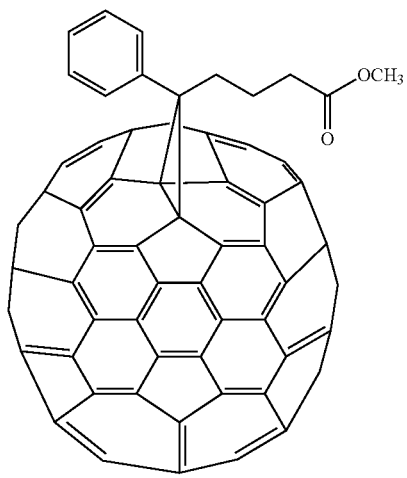

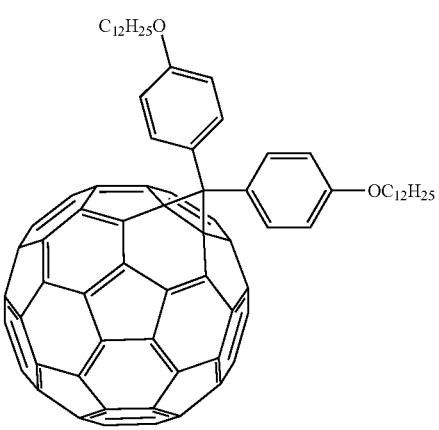

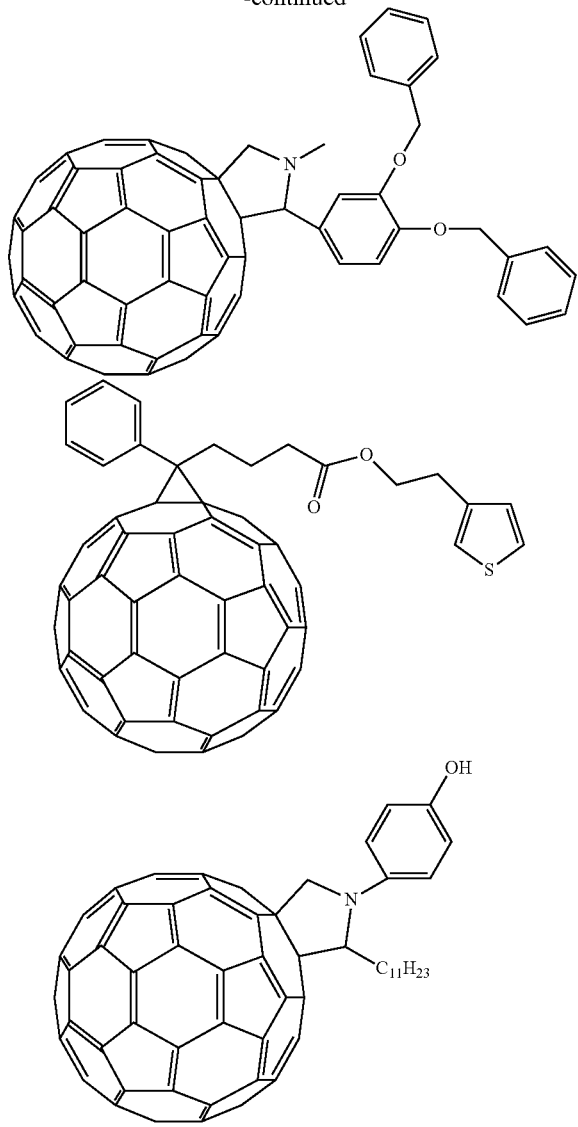

When an unmodified fullerene is used, C70 is preferably used. This fullerene C70 is superior in generation efficiency of photocarriers and is therefore suitable to use in an organic thin-film photovoltaic cell.

As to the blending ratio of the n-type organic semiconductor to the p-type organic semiconductor in the photoelectric conversion layer 13, the content of the n-type organic semiconductor is preferably designed to be 30 to 70% by weight.

In order to apply the organic semiconductor, it is necessary to dissolve the organic semiconductor into a solvent. In this case, examples of the solvent to be used here include unsaturated hydrocarbon type solvents such as toluene, xylene, tetralin, decalin, mesitylene, n-butylbenzene, sec-butylbenzene, and tert-butylbenzene, halogenated aromatic hydrocarbon type solvents such as chlorobenzene, dichlorobenzene, and trichlorobenzene, halogenated saturated hydrocarbon type solvents such as carbon tetrachloride, chloroform, dichloromethane, dichloroethane, chlorobutane, bromobutane, chloropentane, chlorohexane, bromohexane, and chlorocyclohexane, and ethers such as tetrahydrofuran and tetrahydropyran. Particularly, halogen type aromatic solvents are preferable. These solvents may be used either alone or in combination.

Examples of a method of applying the solution to form a film include the spin coating method, dip coating method, casting method, bar coating method, roll coating method, wire bar coating method, spraying method, screen printing, gravure printing method, flexoprinting method, offset printing method, gravure offset printing, dispenser coating, nozzle coating method, capillary coating method, and ink jet method. These coating methods may be used either alone or in combination.

(Electron Transport Layer)

The electron transport layer 15 is optionally arranged between the negative electrode 12 and the photoelectric conversion layer 13. Usually, a transparent or semitransparent material is formed as a film by the vacuum deposition method, sputtering method, ion plating method, plating method, coating method, or the like. Examples of a material for the electron transport layer 15 may include quinolines such as $Alq_3$, phenanthroline derivatives such as BCP, oxadiazole derivatives such as BND, PBD, and further, OXD, oxadiazole dimers, starburst oxadiazole, triazole derivatives, phenylquinoxaline derivatives, and silole derivatives, and inorganic materials such as titanium oxide, fullerenes, alkali metals such as lithium fluoride and halides and oxides of alkali earth metals. The adequate film thickness of the electron transport layer 15 is generally in a range of 0.1 to 100 nm though it needs some adjustment because it differs depending on the material which is used. When the film thickness is less than the above range, the hole block effect is reduced, so that generated excitons are deactivated before they are dissociated into electrons and holes and therefore, current cannot be extracted efficiently. When the film thickness is higher, the electron transport layer 15 acts as a resistor to cause a voltage drop. Further, since it takes long time to form the electron transport layer 15, a temperature of a material is rose, which damages an organic layer resulting in deteriorated performance. Moreover, due to using a large amount of the material, the time required for the treatment in an apparatus for forming a film becomes longer, leading to increased cost.

(Negative Electrode)

The negative electrode 12 is formed on the photoelectric conversion layer 13 (or electron transport layer 15). A material exhibiting conductivity is formed as a film by the vacuum deposition method, sputtering method, ion plating method, plating method, coating method, or the like. Examples of the material for the negative electrode 12 include a metallic thin film and metal oxide film exhibiting conductivity. When the positive electrode 11 is formed by using a material having a high work function, it is preferable to form the negative electrode 12 by using a material having a low work function. Examples of the material having a low work function include alkali metals and alkali earth metals. Specific examples of these metals include Li, In, Al, Ca, Mg, Sm, Tb, Yb, Zr, Na, K, Rb, Cs, Ba, and alloys of these metals.

The negative electrode 12 may be a monolayer or stacked layer constituted of materials having different work function. The negative electrode 12 may be formed of an alloy of one or more of the above materials having a lower work function and gold, silver, platinum, copper, manganese, titanium, cobalt, nickel, tungsten, or tin. Examples of the alloy include a lithium/aluminum alloy, lithium/magnesium alloy, lithium/indium alloy, magnesium-silver alloy, magnesium/indium alloy, magnesium/aluminum alloy, indium/silver alloy, and calcium/aluminum alloy.

The film thickness of the negative electrode 12 is 1 to 500 nm and preferably 10 to 300 nm. When the film thickness is lower than the above range, the resistance is excessively increased and therefore, generated charges can be insufficiently transmitted to an external circuit. When the film thickness is higher, it takes long time to form the electron transport layer 15 and a temperature of a material is rose, which damages an organic layer resulting in deteriorated performance. Moreover, because a large amount of the material is used, the time required for the treatment in the apparatus for forming a film becomes longer, leading to increased cost.

(Thermal Annealing Step)

The photovoltaic cell device manufactured as above is subjected to thermal annealing. The thermal annealing is performed by heating the substrate to a predetermined temperature rapidly by a heater such as a hot plate and continuing the heating for an arbitrary time. An AC voltage is applied to the device at the same time during heating. The application of the voltage is performed by connecting an output of a power amplifier capable of generating a desired waveform according to signals from a frequency generator to the positive electrode and negative electrode of the manufactured device. Parameters such as output voltage, frequency, duty ratio, and offset value are set to apply voltage to the device.

After completion of the thermal annealing for a predetermined time, the substrate is transferred to on a metal plate or the like to cool. After the substrate is cooled, the applied bias is chopped to complete this treating process. If the applied bias is chopped when the substrate is in the state of high-temperature, a layer of oriented semiconductor returns to an original unorganized state. Therefore, it is preferable to chop the applied bias after the substrate is cooled.

The thermal annealing is preferably performed at 70 to 170° C. When the temperature is less than 70° C., molecules in the photoelectric conversion layer are difficult to move and are insufficiently oriented, thereby reducing photoelectric conversion efficiency. Further, when the temperature exceeds 170° C., the motion of molecules in the photoelectric conversion layer becomes too intense, causing coagulation of molecules. It is considered that the coagulation causes the device to develop short circuits, leading to reduce photoelectric conversion efficiency.

The time required for the thermal annealing is preferably 10 seconds to 30 minutes. When the thermal annealing is performed for 10 seconds or more, heat is sufficiently conducted to the device substrate, allowing the photoelectric conversion layer to reach a predetermined temperature, with the result that the photoelectric conversion efficiency of the device is improved. It is considered that when the thermal annealing is performed for 30 minutes or more, the photoelectric conversion efficiency of the device is reduced because polymers in the device are deteriorated by heat.

The frequency of the AC voltage to be applied is preferably 0.01 kHz or more and less than 1 kHz. It is preferable that the frequency be 0.01 kHz or more because the orientation of semiconductor materials is promoted by the application of voltage and it is observed that the photoelectric conversion efficiency of the device is improved. When the frequency is designed to be 1 kHz or more, frequency components act as DC components, thereby to reduce efficiency.

The duty ratio of the forward-bias to reverse-bias of the AC voltage to be applied is preferably 1:1 to 25:1. The duty ratio here means the ratio of the time during which forward-bias voltage is applied to the time during which reverse-bias is applied. Here, the forward-bias means the case where a positive voltage is applied to the positive electrode side and the reverse-bias means that case where a negative voltage is applied to the positive electrode side. When the ratio of the reverse-bias is large, it is inferred that the orientation of the semiconductor material is hindered, causing reduced photoelectric conversion efficiency. On the other hand, when the ratio of the forward-bias exceeds the above range, frequency components act as DC components to reduce photoelectric conversion efficiency.

The voltage value Vac of the AC voltage to be applied is preferably within a range of 0.5 to 30 Vp-p. When the applied voltage is 0.5 Vp-p or more, the orientation of the semiconductor material is promoted by the application of voltage, leading to improved photoelectric conversion efficiency. In view of photoelectric conversion efficiency, it is favorable that the applied voltage be designed to be 30 Vp-p or less, because such a phenomenon that short circuits are developed by excessively high voltage does not occur. Further, the applied voltage is preferably a value satisfying the relationship $2.5 \times 10^3$ [V/mm]<Vac/L<$2 \times 10^5$ [V/mm] when it is converted into electric field intensity wherein L is the distance between the positive electrode and negative electrode.

As mentioned above, an AC/DC superposition voltage, which is obtained by superposing a DC voltage on an AC voltage, may be used as the voltage to be applied during the thermal annealing. In this case, the DC voltage to be superposed is preferably −8 to 10 V. This is because when the absolute value of the DC voltage is high, there is the possibility that the device develops short circuits, which deteriorates the photoelectric conversion efficiency of the device.

When the AC/DC superposition voltage is applied, the frequency is also preferably 0.01 kHz or more and less than 1 kHz. The reason for that is the same as in the case of applying only an AC voltage.

(Seal Step)

Finally, seal treatment is performed to protect the device from oxygen and water and leader electrodes are drawn from the positive and negative electrodes to make a photovoltaic cell. The sealing is performed using a heatcurable or UV-curable epoxy resin or the like as a fixing agent to protect the surface with glass, a metal plate, or a resin film (for example, PET, PEN, PI, EVOH, CO, EVA, PC, and PES) on the surface of which a film of an inorganic material or metal (such as silica, titania, zirconia, silicon nitride, boron nitride or Al) is formed. Moreover, the improvement of device life can be expected by an introduction of a drying agent and oxygen absorber into a sealed space.

The above explanations are furnished as to the organic electroluminescent device having a structure in which a positive electrode, a photoelectric conversion layer, and a negative electrode are arranged in this order on a substrate. However, a negative electrode, a photoelectric conversion layer, and a positive electrode may be arranged in this order on a substrate.

Next, the principle of power generation of the organic thin-film photovoltaic cell of the embodiment will be explained.

FIG. 4 is a view for explaining the action mechanism of a bulk hetero-junction type photovoltaic cell. The photoelectric conversion process of the organic thin-film photovoltaic cell is largely divided into a) a step in which organic molecules absorb light to generate excitons, b) a step of immigration and diffusion of excitons, c) a step of charge separation of excitons, and a step of charge transportation to both electrodes.

In the step a), a donor or acceptor absorbs light to generate excitons. This exciton formation efficiency is defined as $\eta 1$. Next, in the step b), the formed excitons are moved to the p/n junction surface by diffusion. This exciton diffusion efficiency is defined as $\eta 2$. Because excitons each have limited life, they can move only a distance of the order of a diffusion length. In the step c), the excitons which reach the p/n junction surface are separated into electrons and holes. This exciton separation efficiency is defined as $\eta 3$. Finally, in the step d), each photocarrier is transported to the electrodes through the p/n material and extracted into an external circuit. This exciton transportation efficiency is defined as $\eta 4$.

The external extraction efficiency of carriers formed for photons to be applied may be given by the following formula. This value corresponds to the quantum efficiency of the photovoltaic cell.

$$\eta_{EQE} = \eta 1 * \eta 2 * \eta 3 * \eta 4.$$

EXAMPLES

Example 1

Example 1 shows an example in which AC voltage is applied during thermal annealing to fabricate an organic thin-film photovoltaic cell.

First, a solid component of an organic semiconductor which was to be a photoelectric conversion layer was prepared. 50 parts by weight of P3HT (poly3-hexylthiophene: Plexcore OS2100 (trademark), manufactured by Sigma Aldrich Corporation) which was a p-type organic semiconductor was mixed with 50 parts by weight of 70PCBM (70PCBM Fullerene 99%, manufactured by Solenne BV, [6,6]-phenylC71 methyl butyrate) which was a n-type semiconductor.

Next, 25 mg of the above solid was added to 1 ml of monochlorobenzene which was a solvent in a sample bottle to dissolve the solid at 50° C. by ultrasonic irradiation for 2 hours in an ultrasonic cleaner (trade name: US-2, manufactured by As One Co., Ltd.) to obtain a coating solution K which was to be a photoelectric conversion layer. Finally, the coating solution K which was to be a photoelectric conversion layer was filtered by a 0.2-μm filter.

As the substrate, a glass substrate having a size of 20 mm×20 mm×0.7 mm (thickness) was used. An ITO transparent conductive layer was deposited in a thickness of 140 nm by the sputtering method to obtain a glass substrate with ITO in which the ITO part was patterned into a 3.2 mm×20 mm rectangular form by the photolithographic method.

This substrate was ultrasonically cleaned in pure water containing 1% of a surfactant (trade name: NCW1001, manufactured by Wako Pure Chemical Industries, Ltd.), and was then washed with flowing pure water for 15 minutes. The substrate was further ultrasonically cleaned with acetone for 5 minutes, further ultrasonically cleaned with IPA for 5 minutes, and then dried at 120° C. for 60 minutes in a thermostat.

Thereafter, this substrate was subjected to UV treatment carried out for 10 minutes to make the surface hydrophilic.

Film formation using coating was performed in the following process.

First, an aqueous PEDOT/PSS solution (trade name: Baytron PH500, manufactured by H.C. Starck GmbH, poly(3,4-ethylenedioxythiophene)-poly(styrenesulfonate)) which was to be a hole transport layer was formed as a film in a thickness of 50 nm on the glass substrate with ITO which was fabricated above by the spin coating method. Then, the film was dried by heating on a 200° C. hot plate for 5 minutes. In this case, as aqueous PEDOT/PSS solution, a solution filtered by a 0.1-μm filter in advance was used.

Next, a coating solution K which was to be a photoelectric conversion layer was added dropwise on the hole transfer layer to form a photoelectric conversion layer having a film thickness of 100 nm by the spin coating method.

Then, an aluminum layer was formed as a negative electrode by the vacuum deposition method using vacuum depositing equipment. The glass substrate with ITO in which the application of the photoelectric conversion layer was finished was set to a substrate holder, and a negative electrode pattern mask was arranged on the glass substrate to be then placed in the vacuum depositing equipment. The negative electrode pattern mask had a rectangular slit of 3.2 mm in width and was arranged such that the ITO layer crosses the slit. Therefore, the area of the organic thin-film photovoltaic cell device was the area of the crossed part and specifically, 0.1024 cm² (3.2 mm×3.2 mm). The air in the equipment was exhausted until the degree of vacuum reached $3 \times 10^{-6}$ torr to deposit an Al wire material in a thickness of 80 nm by the resistance heating method.

Figure 5:
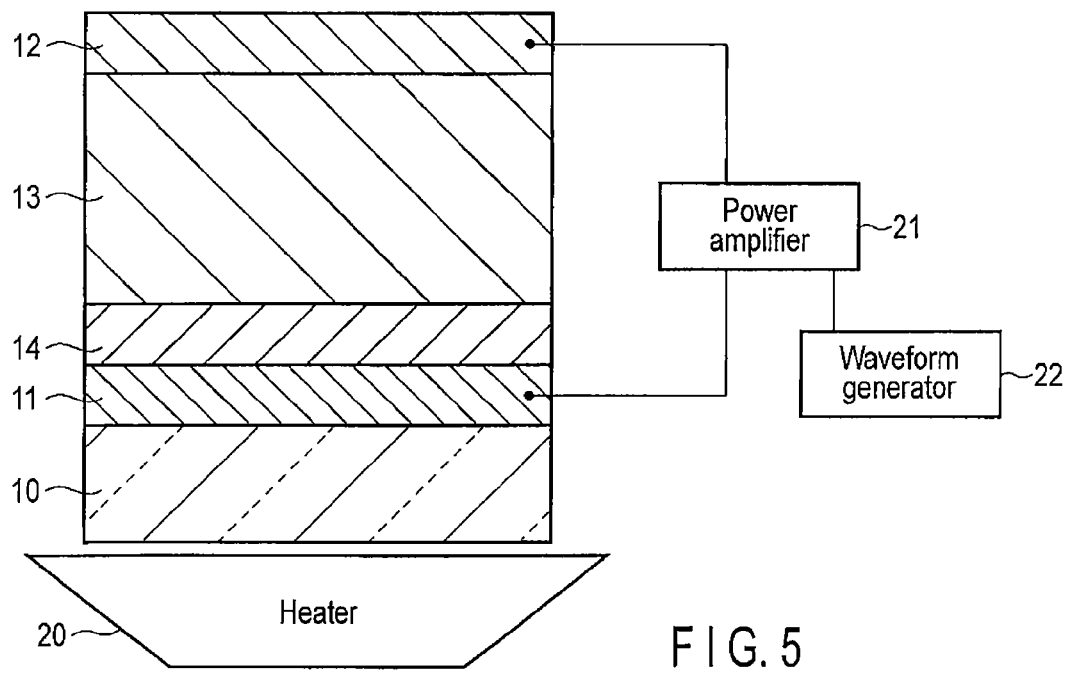
FIG. 5 is a conceptual view of a device used to perform thermal annealing while applying a voltage.

Then, the substrate for which the vacuum deposition was finished was annealed while applying AC bias on a hot plate. FIG. 5 is a conceptual view of the equipment for carrying out thermal annealing while applying voltage. A power amplifier 21 is connected to the positive electrode 11 and negative electrode 12 of the device. A hot plate was used as a heater 20. It is desirable that the heating be performed in such a manner that the heating part is brought into direct contact with the device substrate so that heat conduction to the device body is facilitated. The waveform was generated in a waveform generator 22 to draw output from a power amplifier 21.

When a positive voltage was applied to the positive electrode side, it is referred to as a forward-bias. In contrast, when a negative voltage was applied to the positive electrode side, it is referred to as a reverse-bias.

The device was annealed at 150° C. for 10 minutes on a hot plate while applying a voltage from a power source generating a sine wave having a voltage AC 10 Vp-p and a frequency of 0.5 kHz. After the device was cooled on a metal plate, the application of a voltage was stopped.

Next, the post-annealing substrate was sealed by bonding a seal glass cut in its center with an epoxy resin.

Finally, leader electrodes were drawn from the positive and negative electrodes to make an organic thin-film photovoltaic cell.

With regard to the organic thin-film photovoltaic cell fabricated in this manner, its photoelectric conversion efficiency η was measured using an electric generating power measuring device (manufactured by Maki Manufacturing Co., Ltd.). The measuring light source was a solar simulator attached to the device and had a power providing an irradiance of 100 mW/cm². Using this device, the IV characteristic of the photovoltaic cell was measured by the electronic load method. The calculated photoelectric conversion efficiency was 3.67%.

Example 2

An organic thin-film photovoltaic cell was fabricated in the same manner as in Example 1 except that the applied voltage was changed to an AC/DC superposition voltage obtained by superposing DC +4 V on AC 10 Vp-p. The photoelectric conversion efficiency calculated in the same manner as in Example 1 was 4.45%.

Comparative Example 1

An organic thin-film photovoltaic cell was fabricated in the same manner as in Example 1 except that only the heating treatment was performed without applying a voltage. The photoelectric conversion efficiency calculated in the same manner as in Example 1 was 3.11%.

Comparative Example 2

An organic thin-film photovoltaic cell was fabricated in the same manner as in Example 1 except that a DC voltage of −5

V was applied in place of the AC voltage. The photoelectric conversion efficiency calculated in the same manner as in Example 1 was 3.19%.

Comparative Example 3

An organic thin-film photovoltaic cell was fabricated in the same manner as in Example 1 except that a DC voltage of +3 V was applied in place of the AC voltage. The photoelectric conversion efficiency calculated in the same manner as in Example 1 was 3.32%.

Figure 6:
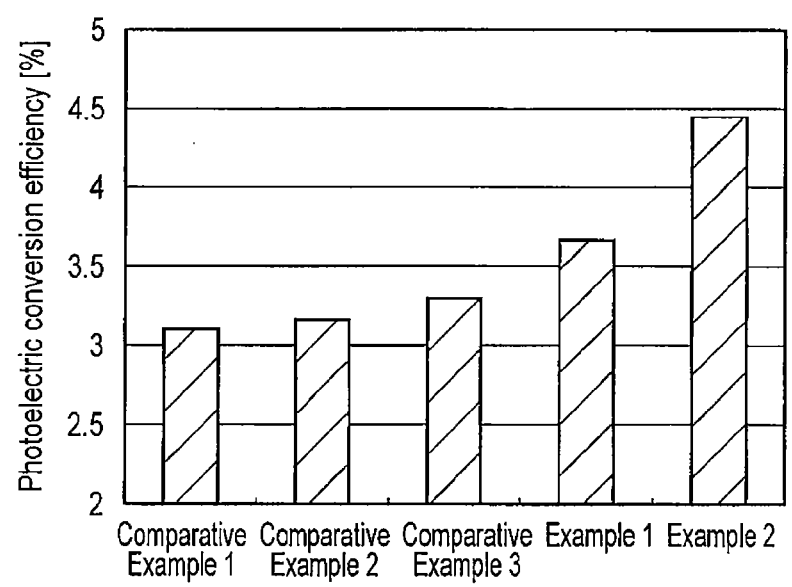
FIG. 6 is a view for comparing a photoelectric conversion efficiency of a photovoltaic cell obtained in an example with that of a photovoltaic cell obtained in a comparative example.

The photoelectric conversion efficiencies of Examples 1 and 2 and Comparative Examples 1 to 3 are summarized in FIG. 6.

When voltage is applied, the photoelectric conversion efficiency was more improved than in the case of applying no voltage. Further, the photoelectric conversion efficiency was more significantly improved in the case of applying an AC voltage than in the case of applying a DC voltage. Particularly, the improvement of photoelectric conversion efficiency was most remarkable in the case of applying an AC/DC superposition voltage.

Test Example 1

Investigation on Optimum Frequency Range

The optimum range of the frequency of AC voltage to be applied was investigated. The frequency of the AC voltage to be applied was varied to fabricate organic thin-film photovoltaic cells in the same manner as that described in Example 1 and the photoelectric conversion efficiencies of the organic thin-film photovoltaic cells were compared with each other. The results are shown in Table 1. In this case, the voltage to be applied was fixed at AC 10 Vp-p.

TABLE 1

Investigation on optimum frequency range

| AC voltage [Vp-p] | Frequency [kHz] | Conversion efficiency [%] |
|---|---|---|
| Float | | 3.12 |
| 10 | 0.001 | 3.15 |
| 10 | 0.01 | 3.38 |
| 10 | 0.1 | 3.53 |
| 10 | 0.5 | 3.67 |
| 10 | 1 | 3.42 |
| 10 | 2 | 3.11 |
| 10 | 10 | 3.13 |
| 10 | 100 | 2.99 |

The photoelectric conversion efficiency was improved when the frequency was 0.01 to 1 kHz.

Test Example 2

Investigation on Optimum Range of Voltage Value

The optimum range of the AC voltage to be applied was investigated. The value of the AC voltage to be applied was varied to fabricate organic thin-film photovoltaic cells in the same manner as that described in Example 1 and the photoelectric conversion efficiencies of the organic thin-film photovoltaic cells were compared with each other. The results are shown in Table 2. In this case, the frequency of the voltage was fixed at 0.5 kHz (sine wave).

TABLE 2

Investigation on optimum range of voltage value

| AC voltage [Vp-p] | Electric field intensity [V/mm] | Frequency [kHz] | Conversion efficiency [%] |
|---|---|---|---|
| Float | — | — | 3.11 |
| 0.1 | $6.7 \times 10^2$ | 0.5 | 3.1 |
| 0.25 | $1.7 \times 10^3$ | 0.5 | 3.09 |
| 0.5 | $3.3 \times 10^3$ | 0.5 | 3.2 |
| 1 | $6.7 \times 10^3$ | 0.5 | 3.22 |
| 2 | $1.3 \times 10^4$ | 0.5 | 3.23 |
| 4 | $2.7 \times 10^4$ | 0.5 | 3.52 |
| 5 | $3.3 \times 10^4$ | 0.5 | 3.56 |
| 7 | $4.7 \times 10^4$ | 0.5 | 3.61 |
| 10 | $6.7 \times 10^4$ | 0.5 | 3.62 |
| 15 | $1.0 \times 10^5$ | 0.5 | 3.55 |
| 20 | $1.3 \times 10^5$ | 0.5 | 3.34 |
| 30 | $2.0 \times 10^5$ | 0.5 | 3.21 |
| 40 | $2.7 \times 10^5$ | 0.5 | 0.28 |

The photoelectric conversion efficiency was improved when the AC voltage to be applied was 0.5 to 30 Vp-p. In this case, the thickness of the organic layer was 150 nm (PEDOT/PSS 50 nm+Photoelectric conversion layer 100 nm) and therefore, when the thickness is converted into the electric field intensity, it corresponds to an electric field intensity ranging from $3.3 \times 10^3$ to $2.0 \times 10^5$ V/mm.

Test Example 3

Investigation on Optimum Duty Ratio Range

The optimum range of the duty ratio (ratio of the time during which forward-bias voltage was applied to the time during which reverse-bias voltage was applied) of the AC voltage to be applied was investigated. The duty ratio of the AC voltage to be applied was varied to fabricate organic thin-film photovoltaic cells in the same manner as that described in Example 1 and the photoelectric conversion efficiencies of the organic thin-film photovoltaic cells were compared with each other. The results are shown in Table 3. In this case, the voltage to be applied was fixed at AC 10 Vp-p and the frequency of the voltage was fixed at 0.5 kHz (sine wave).

TABLE 3

Investigation on optimum range of duty ratio

| AC voltage [Vp-p] | Frequency [kHz] | Duty ratio (Forward-bias:Reverse-bias) | Conversion efficiency [%] |
|---|---|---|---|
| Float | — | — | 3.12 |
| 10 | 0.5 | 1:50 | 2.63 |
| 10 | 0.5 | 1:25 | 2.56 |
| 10 | 0.5 | 1:10 | 2.58 |
| 10 | 0.5 | 1:5 | 3.08 |
| 10 | 0.5 | 1:2 | 3.11 |
| 10 | 0.5 | 1:1 | 3.64 |
| 10 | 0.5 | 2:1 | 3.6 |
| 10 | 0.5 | 5:1 | 3.41 |
| 10 | 0.5 | 10:1 | 3.42 |
| 10 | 0.5 | 25:1 | 3.39 |
| 10 | 0.5 | 50:1 | 3.16 |

The photoelectric conversion efficiency was improved when the duty ratio was 1:1 to 25:1 (Forward-bias:Reverse-bias).

Test Example 4

Investigation on Optimum Annealing Temperature Range

The optimum range of the heat treating temperature (annealing temperature) in the thermal annealing was investigated. The annealing temperature was varied to fabricate organic thin-film photovoltaic cells in the same manner as that described in Example 1 and the photoelectric conversion efficiencies of the organic thin-film photovoltaic cells were compared with each other. The results are shown in Table 4. In this case, the voltage to be applied was fixed at AC 10 Vp-p, and the frequency of the voltage was fixed at 0.5 kHz.

TABLE 4

Investigation on optimum annealing temperature range

| AC voltage [Vp-p] | Frequency [kHz] | Annealing temperature [° C.] | Conversion efficiency [%] |
|---|---|---|---|
| 10 | 0.5 | 2525 (no heat treatment) | 2.21 |
| 10 | 0.5 | 40 | 2.23 |
| 10 | 0.5 | 70 | 3.4 |
| 10 | 0.5 | 100 | 3.44 |
| 10 | 0.5 | 120 | 3.42 |
| 10 | 0.5 | 150 | 3.62 |
| 10 | 0.5 | 160 | 3.62 |
| 10 | 0.5 | 170 | 3.41 |
| 10 | 0.5 | 200 | 0.96 |

There was no significant difference in conversion efficiency compared to the case of carrying out no heat treatment as long as the annealing temperature was less than 40° C. The photoelectric conversion efficiency was improved when the annealing temperature was 70 to 170° C.

Test Example 5

Investigation on Optimum Range of Annealing Time

The optimum value of the annealing time in the thermal annealing was investigated while applying voltage. The annealing time was varied to fabricate organic thin-film photovoltaic cells in the same manner as that described in Example 1 and the photoelectric conversion efficiencies of the organic thin-film photovoltaic cells were compared with each other. The results are shown in Table 5. In this case, the voltage to be applied was fixed at AC 10 Vp-p, the frequency of the voltage was fixed at 0.5 kHz, and the annealing temperature was fixed at 150° C.

TABLE 5

Investigation on optimum range of annealing time

| AC voltage [Vp-p] | Frequency [kHz] | Annealing time | Conversion efficiency [%] |
|---|---|---|---|
| 10 | 0.5 | 1 sec. | 1.95 |
| 10 | 0.5 | 5 sec. | 2.12 |
| 10 | 0.5 | 10 sec. | 3.38 |
| 10 | 0.5 | 1 min. | 3.59 |
| 10 | 0.5 | 5 min. | 3.53 |
| 10 | 0.5 | 10 min. | 3.68 |
| 10 | 0.5 | 20 min. | 3.67 |
| 10 | 0.5 | 30 min. | 3.68 |
| 10 | 0.5 | 45 min. | 3.12 |
| 10 | 0.5 | 60 min. | 2.87 |

Although the conversion efficiency was about 2% when the annealing time was 5 seconds or less, annealing treatment performed for 10 seconds or more allows a conversion efficiency of 3% level to be observed. Further, the highest photoelectric conversion efficiency was obtained when the annealing time was in a range of 10 to 30 minutes. It is said from the above results that the optimum range of the annealing time is within a range of 10 seconds to 30 minutes.

Test Example 6

Investigation on Optimum Range of DC Voltage to be Superposed

When an AC/DC superposition voltage was applied in the thermal annealing step, the optimum range of the value of DC voltage to be superposed was examined. The value of the superposed DC voltage was varied to fabricate organic thin-film photovoltaic cells in the same manner as that described in Example 2 and the photoelectric conversion efficiencies of the organic thin-film photovoltaic cells were compared with each other. The results are shown in Table 6. In this case, the voltage to be applied was fixed at AC 10 Vp-p and the frequency of the voltage was fixed at 0.5 kHz.

TABLE 6

Investigation on optimum range of DC voltage to be superposed

| AC voltage [Vp-p] | Frequency [kHz] | superposed DC voltage [V] | Conversion efficiency [%] |
|---|---|---|---|
| 10 | 0.5 | −12 | 0.36 |
| 10 | 0.5 | −10 | 0.23 |
| 10 | 0.5 | −8 | 3.79 |
| 10 | 0.5 | −6 | 3.83 |
| 10 | 0.5 | −4 | 3.91 |
| 10 | 0.5 | −2 | 3.84 |
| 10 | 0.5 | −1 | 3.85 |
| 10 | 0.5 | 0 | 3.63 |
| 10 | 0.5 | 1 | 4.09 |
| 10 | 0.5 | 2 | 4.11 |
| 10 | 0.5 | 4 | 4.43 |
| 10 | 0.5 | 6 | 4.24 |
| 10 | 0.5 | 8 | 3.86 |
| 10 | 0.5 | 10 | 3.81 |
| 10 | 0.5 | 12 | 2.38 |
| Float | — | — | 3.09 |

When the value of the DC voltage to be superposed was −8 V to 10 V, the improvement of the photoelectric conversion efficiency was observed. Particularly, the AC/DC superposition voltage obtained by superposing a large negative DC voltage was applied, the device tended to be broken. Further, the AC/DC superposition voltage obtained by superposing a positive DC voltage tended to contribute more to the improvement of photoelectric conversion efficiency.

Test Example 7

Investigation on the Optimum Frequency of AC/DC Superposition Voltage

When an AC/DC superposition voltage was applied in the thermal annealing step, the optimum value of the frequency was examined. The value of the frequency of the AC/DC superposition voltage was varied to manufacture organic thin-film photovoltaic cells in the same manner as that described in Example 2 and the photoelectric conversion efficiencies of the organic thin-film photovoltaic cells were compared with each other. The results are shown in Table 7. In this case, the voltage to be applied was fixed at AC 10 Vp-p and the DC voltage to be superposed was fixed at +4 V.

TABLE 7

Investigation on optimum range of frequency of bias superposition current

| AC voltage [Vp-p] | Frequency [kHz] | Superposed DC voltage [V] | Conversion efficiency [%] |
|---|---|---|---|
| 10 | 0.001 | 4 | 3.11 |
| 10 | 0.01 | 4 | 3.92 |
| 10 | 0.1 | 4 | 3.75 |
| 10 | 0.5 | 4 | 4.45 |
| 10 | 1 | 4 | 4.37 |
| 10 | 2 | 4 | 3.17 |
| 10 | 10 | 4 | 3.18 |
| 10 | 100 | 4 | 2.98 |
| Float | — | — | 3.13 |

When the frequency was 0.01 to 1 kHz, the improvement of the photoelectric conversion efficiency was observed. It was also found that the photoelectric conversion efficiency was more improved when an AC/DC superposition voltage was applied than when a non-superposed AC voltage was applied (Example 1).

According to the embodiment or the examples, it is possible to provide a photovoltaic cell improved in photoelectric conversion efficiency and a method for manufacturing the photovoltaic cell.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a photovoltaic cell, comprising:
    forming a structure comprising a pair of electrodes which are arranged apart from each other, and a hetero junction type photoelectric conversion layer interposed between the electrodes and including a p-type semiconductor and a n-type semiconductor; and
    annealing the photoelectric conversion layer thermally while applying an AC voltage having a frequency of 0.01 kHz or more and less than 1 kHz to control a mixed state of the p-type semiconductor and n-type semiconductor in the photoelectric conversion layer.

2. The method according to claim 1,
    wherein at least one of the p-type semiconductor and the n-type semiconductor is an organic semiconductor.
3. The method according to claim 1,
    wherein the photoelectric conversion layer is a layer of bulk hetero junction type.
4. The method according to claim 1,
    wherein the AC voltage (Vac) has a value satisfying a relationship:

$$2.5 \times 10^3 \, [\text{V/mm}] < \text{Vac}/L < 2 \times 10^5 \, [\text{V/mm}]$$

where L represents a distance between the pair of electrodes.
5. The method according to claim 1,
    wherein the AC voltage has a duty ratio of a forward-bias to reverse-bias of 1:1 to 25:1.
6. The method according to claim 1,
    wherein the annealing is carried out at a temperature ranging from 70 to 170° C.
7. The method according to claim 1,
    wherein the annealing is carried out for a time ranging from 10 seconds to 30 minutes.
8. A method for manufacturing a photovoltaic cell, comprising:
    forming a hetero junction type photoelectric conversion layer including a p-type semiconductor and a n-type semiconductor between a pair of electrodes which are arranged apart from each other; and
    annealing the photoelectric conversion layer thermally while applying an AC/DC superposition voltage obtained by superposing a DC voltage on an AC voltage to control a mixed state of the p-type semiconductor and n-type semiconductor in the photoelectric conversion layer, wherein the AC/DC superposition voltage has a frequency of 0.01 kHz or more and less than 1 kHz.
9. The method according to claim 8,
    wherein the DC voltage which is superposed has a value of −8 to +10 V.
10. The method according to claim 1, wherein the p-type semiconductor comprises a material selected from the group consisting of polythiophene, a polythiophene derivative, polypyrrole, a polypyrrole derivative, a pyrazoline derivative, an arylamine derivative, a stilbene derivative, a triphenyldiamine derivative, oligothiophene, an oligothiophene derivative, polyvinylcarbazole, polyvinylcarbazole derivative, polysilane, a polysilane derivative, a polysiloxane derivative having an aromatic amine side chain or main chain, polyaniline, polyaniline derivative, a phthalocyanine derivative, porphyrin, a porphyrin derivative, polyphenylenevinylene, a polyphenylenevinylene derivative, polythienylenevinylene, and a polythienylenevinylene derivative.
11. The method according to claim 10, wherein the p-type semiconductor comprises a material selected from the group consisting of poly3-methylthiophene, poly3-butylthiophene, poly3-hexylthiophene, poly3-octylthiophene, poly3-decylthiophene, poly3-dodecylthiophene, poly3-phenylthiophene, poly3-(p-alkylphenylthiophene), poly3-butylisothionaphthene, poly3-hexylisothionaphthene, poly3-octylisothionaphthene, poly3-decylisothionaphthene, and polyethylenedioxythiophene.
12. The method according to claim 1, wherein the n-type semiconductor comprises a material selected from the group consisting of fullerene, and a fullerene derivative.
13. The method according to claim 12, wherein the n-type semiconductor comprises a material selected from the group consisting of a hydrogenated fullerene selected from C60H36 and C70H36; an oxide fullerene selected from C60 and C70;

a fullerene metal complex; and [6,6]-phenyl C61 methyl butyrate and [6,6]-phenyl C71 methyl butyrate.

14. The method according to claim 8, wherein at least one of the p-type semiconductor and the n-type semiconductor is an organic semiconductor.

15. The method according to claim 8, wherein the photoelectric conversion layer is a layer of bulk hetero junction type.

16. A method for manufacturing a photovoltaic cell, comprising:
   forming a structure comprising a pair of electrodes which are arranged apart from each other, and a bulk hetero junction type photoelectric conversion layer interposed between the electrodes and including a p-type semiconductor and a n-type semiconductor, wherein at least one of the p-type semiconductor and the n-type semiconductor is an organic semiconductor; and
   annealing the photoelectric conversion layer thermally while applying an AC voltage having a frequency of 0.01 kHz or more and less than 1 kHz to control a mixed state of the p-type semiconductor and n-type semiconductor in the photoelectric conversion layer.

* * * * *